United States Patent
Saito et al.

(10) Patent No.: US 9,620,599 B2
(45) Date of Patent: Apr. 11, 2017

(54) GAN-BASED SEMICONDUCTOR TRANSISTOR

(71) Applicant: Kabushiki Kaisha Toshiba, Minato-ku (JP)

(72) Inventors: Hisashi Saito, Kawasaki (JP); Miki Yumoto, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/971,118

(22) Filed: Dec. 16, 2015

(65) Prior Publication Data
US 2016/0225857 A1 Aug. 4, 2016

(30) Foreign Application Priority Data

Feb. 4, 2015 (JP) ................................ 2015-020707

(51) Int. Cl.
*H01L 29/00* (2006.01)
*H01L 29/20* (2006.01)
(Continued)

(52) U.S. Cl.
CPC ...... *H01L 29/2003* (2013.01); *H01L 21/0228* (2013.01); *H01L 29/205* (2013.01);
(Continued)

(58) Field of Classification Search
CPC ........... H01L 29/2003; H01L 29/66462; H01L 29/7787; H01L 29/205; H01L 29/7813; H01L 29/778
See application file for complete search history.

(56) References Cited

U.S. PATENT DOCUMENTS

2007/0158692 A1* 7/2007 Nakayama .......... H01L 29/4236
257/213
2009/0278197 A1* 11/2009 Ohta ................. H01L 21/28587
257/330
(Continued)

FOREIGN PATENT DOCUMENTS

JP 2008-112750 5/2008
JP 2011-529639 12/2011
(Continued)

OTHER PUBLICATIONS

Narihiko Maeda et al. "RF and DC Characteristics in $Al_2O_3/Si_3N_4$ Insulated-Gate AlGaN/GaN Heterostructure Field-Effect Transistors with Regrown Ohmic Structure", Phys. Stat. Sol. A, vol. 203, No. 7, 2006, 5 pages.
(Continued)

*Primary Examiner* — Ngan Ngo
(74) *Attorney, Agent, or Firm* — Oblon, McClelland, Maier & Neustadt, L.L.P.

(57) ABSTRACT

A semiconductor device according an embodiment includes a GaN layer, a GaN-based semiconductor layer provided on the GaN layer and having a wider band gap than the GaN layer, a source electrode electrically connected to the GaN-based semiconductor layer, a drain electrode electrically connected to the GaN-based semiconductor layer, a gate electrode provided in the GaN-based semiconductor layer between the source electrode and the drain electrode, and a gate insulating film provided at least between the GaN layer and the gate electrode, the gate insulating film including a first insulating film and a second insulating film, the first insulating film provided on the GaN layer, the first insulating film having a thickness equal to or greater than 0.2 nm and less than 2 nm, the first insulating film including nitrogen, the second insulating film provided between the first insu-
(Continued)

lating film and the gate electrode, the second insulating film including oxygen.

11 Claims, 6 Drawing Sheets

(51) Int. Cl.
| | |
|---|---|
| H01L 21/02 | (2006.01) |
| H01L 29/778 | (2006.01) |
| H01L 29/78 | (2006.01) |
| H01L 29/205 | (2006.01) |
| H01L 29/51 | (2006.01) |
| H01L 29/66 | (2006.01) |
| H01L 29/49 | (2006.01) |
| H01L 29/423 | (2006.01) |

(52) U.S. Cl.
CPC ...... *H01L 29/513* (2013.01); *H01L 29/66462* (2013.01); *H01L 29/778* (2013.01); *H01L 29/7786* (2013.01); *H01L 29/7787* (2013.01); *H01L 29/7813* (2013.01); *H01L 29/4236* (2013.01); *H01L 29/4966* (2013.01)

(56) References Cited

U.S. PATENT DOCUMENTS

| | | |
|---|---|---|
| 2010/0025730 A1 | 2/2010 | Heikman et al. |
| 2012/0161153 A1 | 6/2012 | Yumoto et al. |
| 2014/0084343 A1 | 3/2014 | Dewey et al. |
| 2014/0239311 A1 | 8/2014 | Kawai et al. |
| 2014/0367699 A1 | 12/2014 | Teramoto et al. |
| 2015/0145004 A1* | 5/2015 | Inoue .................. H01L 29/4236 257/192 |

FOREIGN PATENT DOCUMENTS

| | | |
|---|---|---|
| JP | 2012-156245 | 8/2012 |
| JP | 5537555 | 7/2014 |
| JP | 2014-187344 | 10/2014 |
| WO | WO 2011/039800 A1 | 4/2011 |

OTHER PUBLICATIONS

Narihiko Maeda et al. "Systematic Study of Insulator Deposition Effect ($Si_3N_4$, $SiO_2$, AlN, and $Al_2O_3$) on Electrical Properties in AlGaN/GaN Heterostructures", Japanese Journal of Applied Physics, vol. 46, No. 2, 2007, 9 pages.

* cited by examiner

GAN-BASED SEMICONDUCTOR TRANSISTOR

CROSS-REFERENCE TO RELATED APPLICATION

This application is based upon and claims the benefit of priority from Japanese Patent Application No. 2015-020707, filed on Feb. 4, 2015, the entire contents of which are incorporated herein by reference.

FIELD

Embodiments described herein relate generally to a semiconductor device and a method for manufacturing the same.

BACKGROUND

Semiconductor devices, such as switching devices or diodes, are used in circuits, such as switching power supplies or inverters. The semiconductor devices require a high breakdown voltage and low on resistance. A trade-off relationship which is determined by a semiconductor material is established between the breakdown voltage and the on resistance.

With the progress of technical development, the on resistance of the semiconductor device has been reduced to a value close to the lower limit of the on resistance of silicon which is a representative semiconductor material. It is necessary to change the semiconductor material in order to further increase the breakdown voltage or to further reduce the on resistance. A GaN-based semiconductor, such as GaN or AlGaN, or a wide bandgap semiconductor, such as silicon carbide (SiC), is used as the semiconductor material of the switching device to improve the trade-off relationship determined by the semiconductor material and to achieve a high breakdown voltage or low on resistance.

In a metal insulator semiconductor field effect transistor (MISFET) using the GaN-based semiconductor, there is a concern that a threshold voltage will vary due to the trapping of charge.

DETAILED DESCRIPTION

Figure 1:
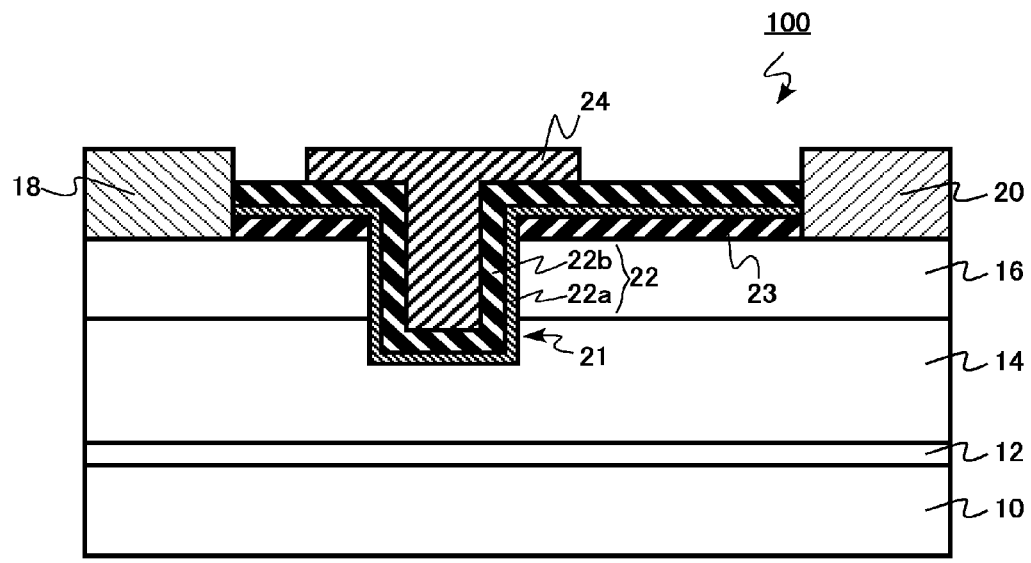
FIG. 1 is a cross-sectional view schematically illustrating a semiconductor device according to an embodiment.

A semiconductor device according an embodiment of the invention includes a GaN layer, a GaN-based semiconductor layer provided on the GaN layer and having a wider band gap than the GaN layer, a source electrode electrically connected to the GaN-based semiconductor layer, a drain electrode electrically connected to the GaN-based semiconductor layer, a gate electrode provided in the GaN-based semiconductor layer between the source electrode and the drain electrode, and a gate insulating film provided at least between the GaN layer and the gate electrode, the gate insulating film including a first insulating film and a second insulating film, the first insulating film provided on the GaN layer, the first insulating film having a thickness equal to or greater than 0.2 nm and less than 2 nm, the first insulating film including nitrogen, the second insulating film provided between the first insulating film and the gate electrode, the second insulating film including oxygen.

In the specification, in some cases, the same or equivalent members are denoted by the same reference numerals and the description thereof will not be repeated.

In the specification, a "GaN-based semiconductor" is a generic term for semiconductors having a gallium nitride (GaN), an aluminum nitride (AlN), an indium nitride (InN), and intermediate compositions thereof.

In the specification, "undope" means that impurity concentration is equal to or less than $1 \times 10^{16}$ cm$^{-3}$.

In the specification, for example, in order to indicate the positional relationship between components, the upward direction of the drawings is described as an "upper side" and the downward direction of the drawings is described as a "lower side". In the specification, the concept of the "upper" and "lower" sides does not necessarily indicate the relationship with the direction of gravity.

A semiconductor device according to an embodiment includes a GaN layer, a GaN-based semiconductor layer that is provided on the GaN layer and has a wider band gap than the GaN layer, a source electrode electrically connected to the GaN-based semiconductor layer, a drain electrode electrically connected to the GaN-based semiconductor layer, a gate electrode provided in the GaN-based semiconductor layer between the source electrode and the drain electrode, and a gate insulating film including a first insulating film that is provided at least between the GaN layer and the gate electrode so as to be arranged on the GaN layer, includes nitrogen, and has a thickness equal to or greater than 0.2 nm and less than 2 nm and a second insulating film that is provided at least between the first insulating film and the gate electrode and includes oxygen.

FIG. 1 is a cross-sectional view schematically illustrating the semiconductor device according to the embodiment. The semiconductor device according to the embodiment is a high electron mobility transistor (HEMT) using a GaN-based semiconductor. The HEMT according to the embodiment has a so-called recessed gate structure in which a gate electrode is buried in a trench formed in a semiconductor layer. In addition, the HEMT according to the embodiment is a normally-off MISFET including a gate insulating film.

As illustrated in FIG. 1, a semiconductor device (HEMT) 100 includes a substrate 10, a buffer layer 12, a channel layer (GaN layer) 14, a barrier layer (GaN-based semiconductor layer) 16, a source electrode 18, a drain electrode 20, a gate insulating film 22, a passivation film (third insulating film) 23, and a gate electrode 24.

The substrate 10 is made of, for example, silicon (Si). For example, sapphire ($Al_2O_3$) or silicon carbide (SiC) can be applied, in addition to silicon.

The buffer layer 12 is provided on the substrate 10. The buffer layer 12 has a function of reducing the lattice mismatch between the substrate 10 and the channel layer 14. The buffer layer 12 has, for example, a multi-layer structure of aluminum gallium nitride ($Al_WGa_{1-W}N$ (0<W<1)).

The channel layer 14 is provided on the buffer layer 12. The channel layer 14 is made of undoped GaN. For example, the thickness of the channel layer 14 is equal to or greater than 0.5 μm and equal to or less than 3 μm.

The barrier layer 16 is provided on the channel layer 14. The band gap of the barrier layer 16 is wider than the band gap of the channel layer 14. The barrier layer 16 is made of, for example, undoped $Al_YGa_{1-Y}N$ (0<Y≤1). More specifically, the barrier layer 16 is made of, for example, undoped $Al_{0.25}Ga_{0.75}N$. For example, the thickness of the barrier layer 16 is equal to or greater than 15 nm and equal to or less than 50 nm.

A heterojunction interface is provided between the channel layer 14 and the barrier layer 16. When the semiconductor device 100 is turned on, a two-dimensional electron gas (2DEG) is formed at the heterojunction interface and functions as a carrier.

The passivation film (third insulating film) 23 is provided on the barrier layer 16. The passivation film (third insulating film) 23 has a function of protecting the surface of the barrier layer 16. The passivation film 23 is, for example, a silicon nitride (SiNx) film, an aluminum nitride (AlNx) film, a silicon oxynitride (SiOyNx) film, or an aluminum oxynitride (AlOyNx) film.

The source electrode 18 and the drain electrode 20 are formed on the barrier layer 16 so as to be electrically connected to the barrier layer 16. The source electrode 18 and the drain electrode 20 are, for example, metal electrodes. The metal electrode has, for example, a stacked structure of titanium (Ti) and aluminum (Al). It is preferable that the source electrode 18 and the drain electrode 20 come into ohmic contact with the barrier layer 16. For example, the distance between the source electrode 18 and the drain electrode 20 is equal to or greater than 5 μm and equal to or less than 30 μm.

A trench 21 is provided in the barrier layer 16 between the source electrode 18 and the drain electrode 20. The gate insulating film 22 is formed on the inner surface of the trench 21. The gate electrode 24 is provided on the gate insulating film 22. The gate electrode 24 is buried in the trench 21. The bottom of the trench 21 is provided in the channel layer 14.

In other words, the gate electrode 24 is provided in the barrier layer 16 between the source electrode 18 and the drain electrode 20. The gate insulating film 22 is provided between the channel layer 14 and the barrier layer 16, and the gate electrode 24. The gate insulating film 22 comes into direct contact with the channel layer 14 at the bottom of the trench 21.

The semiconductor device 100 according to the embodiment has a recessed gate structure. The bottom of the trench 21 reaches the channel layer 14 and a metal insulator semiconductor (MIS) structure is formed immediately below the gate electrode 24. The formation of an inversion layer and a depletion layer in the channel layer 14 is controlled by a voltage applied to the gate electrode 24 to control the turn-on and turn-off of a channel. Therefore, it is possible to achieve a normally-off HEMT.

The gate insulating film 22 includes a first insulating film 22a that is provided between the channel layer 14 and the gate electrode 24 and a second insulating film 22b that is provided between the first insulating film 22a and the gate electrode 24. The gate insulating film 22 has a stacked structure of the first insulating film 22a and the second insulating film 22b.

The first insulating film 22a includes nitrogen. The thickness of the first insulating film 22a is equal to or greater than 0.2 nm and less than 2 nm. It is preferable that the thickness of the first insulating film 22a be equal to or greater than 0.5 nm and equal to or less than 1 nm.

The first insulating film 22a is, for example, a silicon nitride (SiNx) film, an aluminum nitride (AlNx) film, a silicon oxynitride (SiOyNx) film, or an aluminum oxynitride (AlOyNx) film.

The second insulating film 22b includes oxygen. The nitrogen concentration of the second insulating film 22b is lower than that of the first insulating film 22a. It is preferable that the thickness of the second insulating film 22b be greater than the thickness of the first insulating film 22a. For example, the thickness of the second insulating film 22b is equal to or greater than 10 nm and equal to or less than 50 nm. The second insulating film 22b is, for example, a silicon oxide (SiOx) film or an aluminum oxide (AlOx) film.

Elements included in the first insulating film 22a or the second insulating film 22b can be analyzed by, for example, high-resolution Rutherford back-scattering (RBS) spectrometry or secondary ion mass spectrometry (SIMS). In addition, the thickness of the first insulating film 22a or the second insulating film 22b can be measured by, for example, a high-resolution transmission electron microscope (TEM).

In this embodiment, the gate insulating film 22 is formed inside and outside the trench 21 which extends from the surface of the barrier layer 16 (GaN-based semiconductor layer) to the channel layer (GaN layer) 14. The passivation film (third insulating film) 23 is provided between the gate insulating film 22 provided outside the trench 21 and the barrier layer 16 (GaN-based semiconductor layer).

The gate electrode 24 is made of, for example, metal or doped polysilicon. Examples of the metal include titanium nitride (TiN), tungsten (W), nickel (Ni), tungsten nitride (WN) and tantalum nitride (TaN).

Next, an example of a method for manufacturing the semiconductor device according to the embodiment will be described. FIGS. 2 to 7 are cross-sectional views schematically illustrating the semiconductor device which is being manufactured in the method for manufacturing the semiconductor device according to the embodiment.

In the method for manufacturing the semiconductor device according to the embodiment, a trench is formed so as to extend, to a GaN layer, from the surface of a GaN-based semiconductor layer which is provided on the GaN layer and has a wider band gap than the GaN layer. Then, a gate insulating film including a first insulating film which is formed on the GaN layer in the trench, includes nitrogen, and has a thickness that is equal to or greater than 0.2 nm and less than 2 nm and a second insulating film which is formed on the first insulating film and includes oxygen is formed. A gate electrode is formed on the gate insulating film.

First, for example, a Si substrate is prepared as the substrate 10. Then, the buffer layer 12 is grown on the Si substrate by, for example, epitaxial growth.

Figure 2:
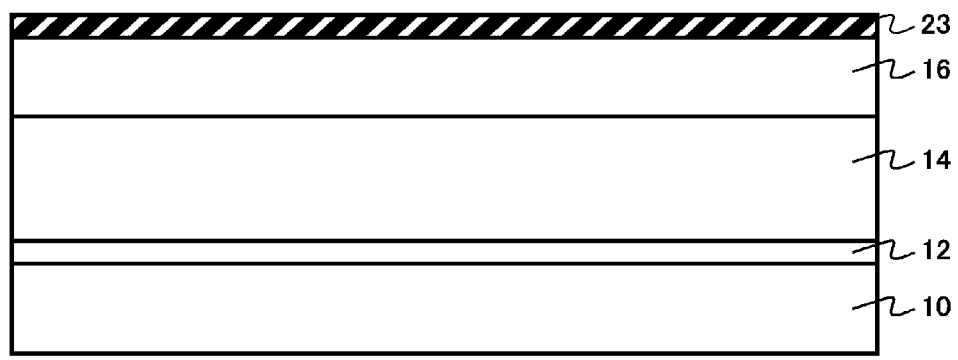
FIG. 2 is a cross-sectional view schematically illustrating the semiconductor device which is being manufactured in a method for manufacturing the semiconductor device according to the embodiment.

Then, undoped GaN, which will be the channel layer (GaN layer) 14, and undoped $Al_{0.25}Ga_{0.75}N$, which will be the barrier layer (GaN-based semiconductor layer) 16, are grown on the buffer layer 12 by epitaxial growth. In addition, the passivation film (third insulating film) 23 is formed on the barrier layer 16 (FIG. 2). The passivation film 23 is a silicon nitride film which is formed by, for example, a low pressure chemical vapor deposition (LPCVD) method.

Figure 3:
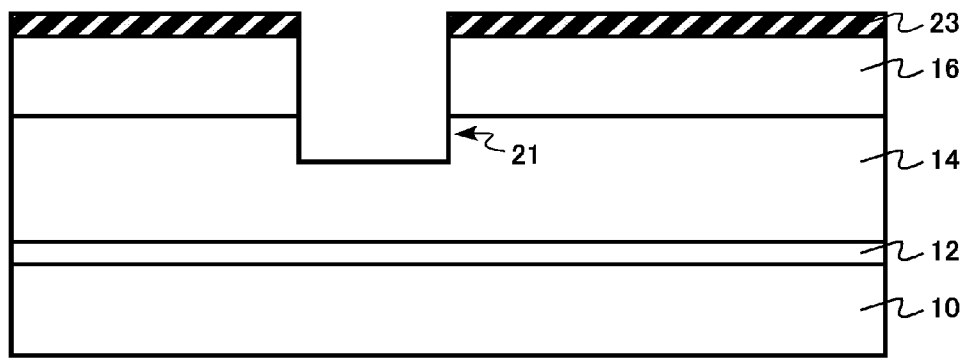
FIG. 3 is a cross-sectional view schematically illustrating the semiconductor device which is being manufactured in the method for manufacturing the semiconductor device according to the embodiment.

Then, the trench 21 which extends from the surface of the passivation film 23 to the channel layer 14 through the barrier layer 16 is formed (FIG. 3). The trench 21 is formed by, for example, a reactive ion etching (RIE) method.

Figure 4:
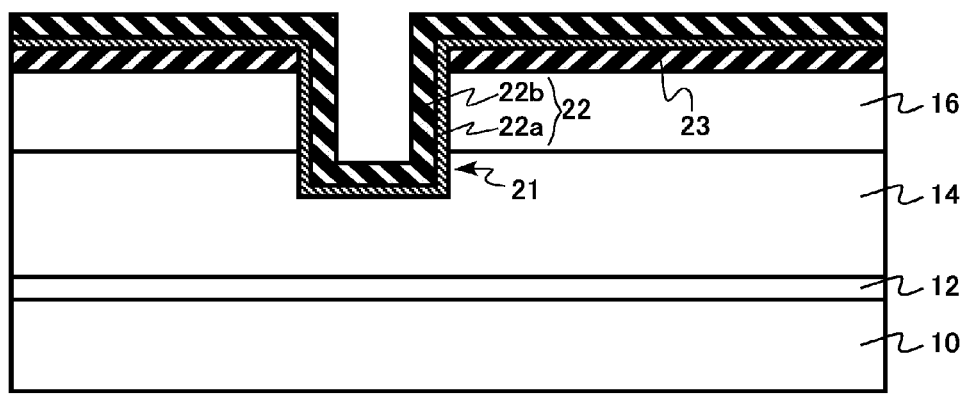
FIG. 4 is a cross-sectional view schematically illustrating the semiconductor device which is being manufactured in the method for manufacturing the semiconductor device according to the embodiment.

Then, the gate insulating film 22 including the first insulating film 22a and the second insulating film 22b is formed on the surfaces of the channel layer 14 and the barrier layer 16 in the trench 21 (FIG. 4). The gate insulating film 22 is formed by, for example, an atomic layer deposition (ALD) method.

When the gate insulating film 22 is formed, first, the first insulating film 22a which includes nitrogen and has a thickness that is equal to or greater than 0.2 nm and less than 2 nm is formed on the channel layer (GaN layer) 14. Then, the second insulating film 22b including oxygen is formed on the first insulating film 22a. It is preferable that the first insulating film 22a and the second insulating film 22b be continuously formed in the same ALD equipment.

For example, first, a first precursor including silicon (Si) is supplied to the surface of the channel layer (GaN layer) 14 and the channel layer (GaN layer) 14 having the first precursor supplied thereto is exposed to plasma including nitrogen to form the first insulating film 22a. For example, the first precursor is tris(dimethyl-amino)silane ($HSi(N(CH_3)_2)_3$ and the plasma including nitrogen is nitrogen ($N_2$) plasma. In this case, the first insulating film 22a is a silicon nitride (SiNx) film.

A single-layer silicon nitride film is formed by the above-mentioned process. For example, the supply of the first precursor and processing in the plasma including nitrogen may be repeatedly performed to form a multi-layer silicon nitride film, thereby increasing the thickness of the first insulating film 22a. For example, a second precursor including aluminum (Al) may be supplied to the surface of the channel layer 14 to form the first insulating film 22a as an aluminum nitride (AlNx) film.

Then, for example, the second precursor including silicon (Si) is supplied to the surface of the first insulating film 22a and the first insulating film 22a having the second precursor supplied thereto is exposed to plasma including oxygen to form the second insulating film 22b. For example, the second precursor is tris(dimethyl-amino)silane ($HSi(N(CH_3)_2)_3$ and the plasma including oxygen is oxygen ($O_2$) plasma. In this case, the second insulating film 22b is a silicon oxide (SiOx) film.

A single-layer silicon oxide film is formed by the above-mentioned process. For example, the supply of the second precursor and processing in the plasma including oxygen may be repeatedly performed to form a multi-layer silicon oxide film, thereby increasing the thickness of the second insulating film 22b. In addition, for example, the second precursor including aluminum (Al) may be supplied to the surface of the first insulating film 22a to form the second insulating film 22b as an aluminum oxide (AlOx) film.

The gate insulating film 22 may be formed as follows: the first insulating film 22a and a portion of the second insulating film 22b are formed by the atomic layer deposition (ALD) method; and the remainder of the second insulating film 22b is formed by a method different from the atomic layer deposition method. For example, after a portion of the second insulating film 22b is formed by the atomic layer deposition (ALD) method, the second insulating film 22b is grown by an LPCVD method such that the thickness thereof increases.

Figure 5:
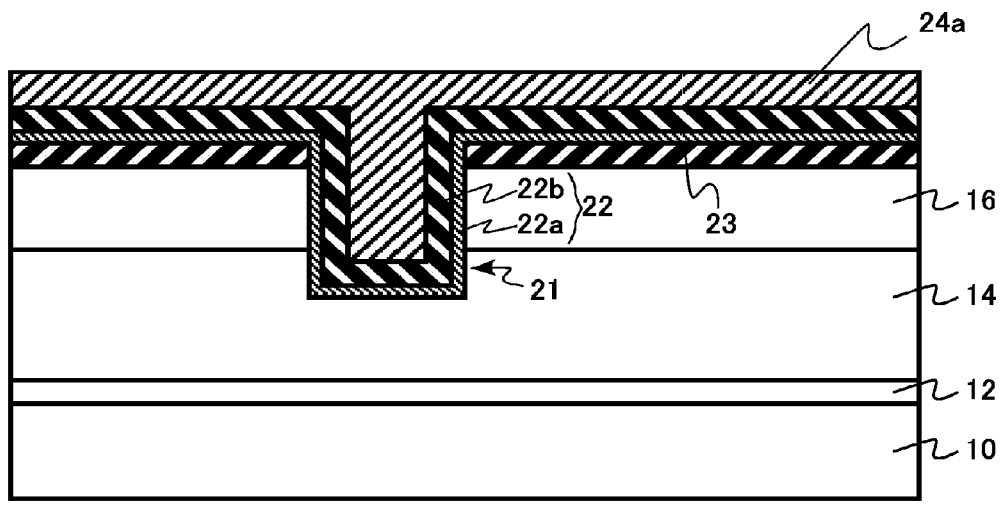
FIG. 5 is a cross-sectional view schematically illustrating the semiconductor device which is being manufactured in the method for manufacturing the semiconductor device according to the embodiment.

Then, for example, a titanium nitride (TiN) film 24a is deposited on the gate insulating film 22 by, for example, a sputtering method (FIG. 5).

Figure 6:
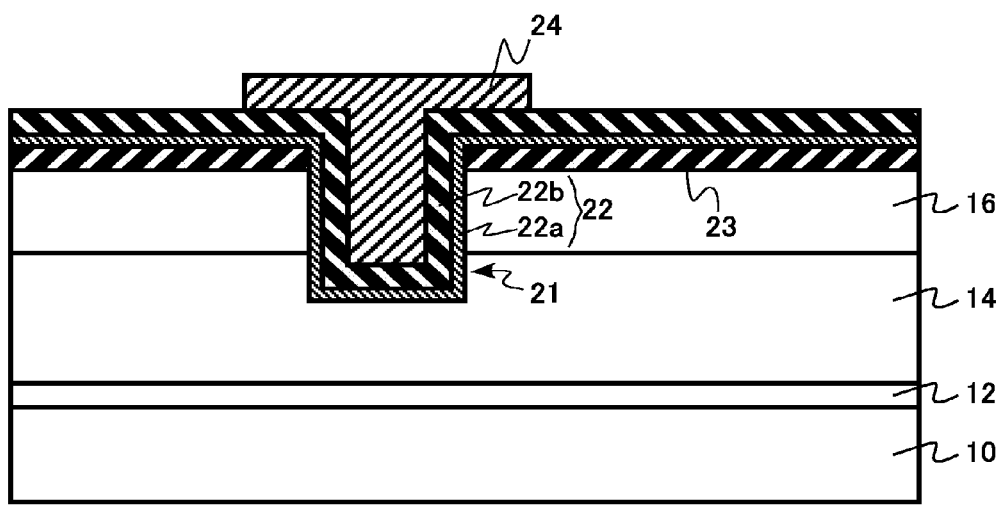
FIG. 6 is a cross-sectional view schematically illustrating the semiconductor device which is being manufactured in the method for manufacturing the semiconductor device according to the embodiment.

Then, the titanium nitride film 24a is patterned to form the gate electrode 24 (FIG. 6). The titanium nitride film 24a is patterned by, for example, an RIE method.

Figure 7:
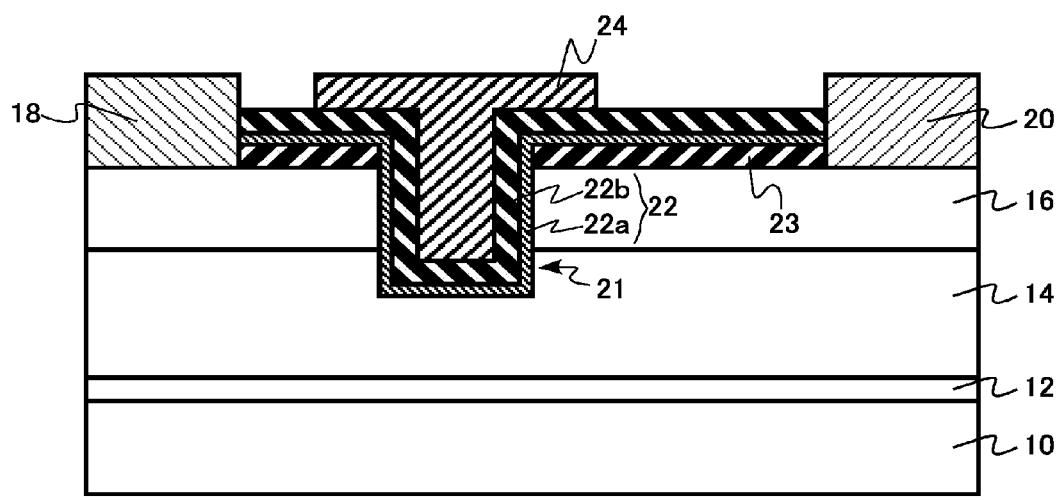
FIG. 7 is a cross-sectional view schematically illustrating the semiconductor device which is being manufactured in the method for manufacturing the semiconductor device according to the embodiment.

Then, the source electrode 18 and the drain electrode 20 which have, for example, a stacked structure of titanium (Ti) and aluminum (Al) are formed on the barrier layer 16 by a liftoff method (FIG. 7).

The semiconductor device 100 illustrated in FIG. 1 is manufactured by the above-mentioned manufacturing method.

Figure 8:
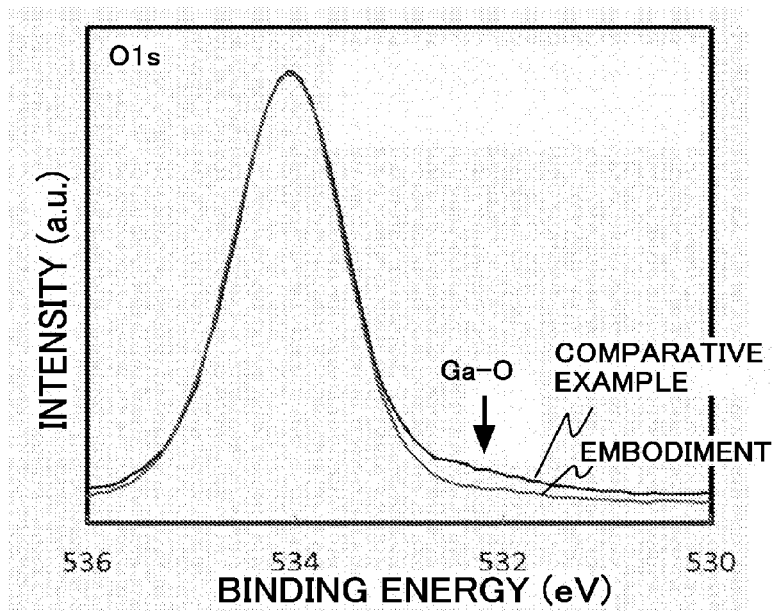
FIG. 8 is a diagram illustrating the function of the semiconductor device according to the embodiment.

Next, the function and effect of the semiconductor device 100 according to the embodiment will be described. FIGS. 8, 9, and 10 are diagrams illustrating the function and effect of the semiconductor device 100 according to the embodiment.

In the MISFET using the GaN-based semiconductor, it is preferable to apply an insulating film with a wide band gap in order to suppress the leakage current of the gate insulating film. An example of the insulating film with a wide band gap is an insulating film including oxygen, such as a silicon oxide film.

However, in some cases, when the insulating film including oxygen, such as a silicon oxide film, is formed as the gate insulating film on the GaN layer, the threshold voltage of the MISFET varies. It is considered that the variation is caused by the trapping of charge to a gallium oxide (GaOx) which is generated by the oxidation of the surface of the GaN layer.

In the semiconductor device 100 according to the embodiment, the first insulating film 22a including nitrogen is provided as an intermediate layer between the second insulating film 22b including oxygen and the channel layer 14 which is a GaN layer. Therefore, the formation of the gallium oxide (GaOx) on the surface of the GaN layer is suppressed. As a result, the trapping of charge is suppressed and a variation in the threshold voltage of the MISFET is suppressed.

FIG. 8 illustrates the evaluation results of the gate insulating film by X-ray photoelectron spectroscopy (XPS) in the embodiment and a comparative example. In the embodiment, the gate insulating film has a stacked structure of a silicon nitride film and a silicon oxide film and is formed by the ALD method. In the comparative example, the gate insulating film is a single-layer silicon oxide film and is formed by the ALD method.

As can be seen from FIG. 8, the strength of the binding energy of gallium and oxygen represented by an arrow in FIG. 8 is reduced in the embodiment. Therefore, in the embodiment, the formation of the gallium oxide (GaOx) on the surface of the GaN layer is suppressed.

Figure 9A:
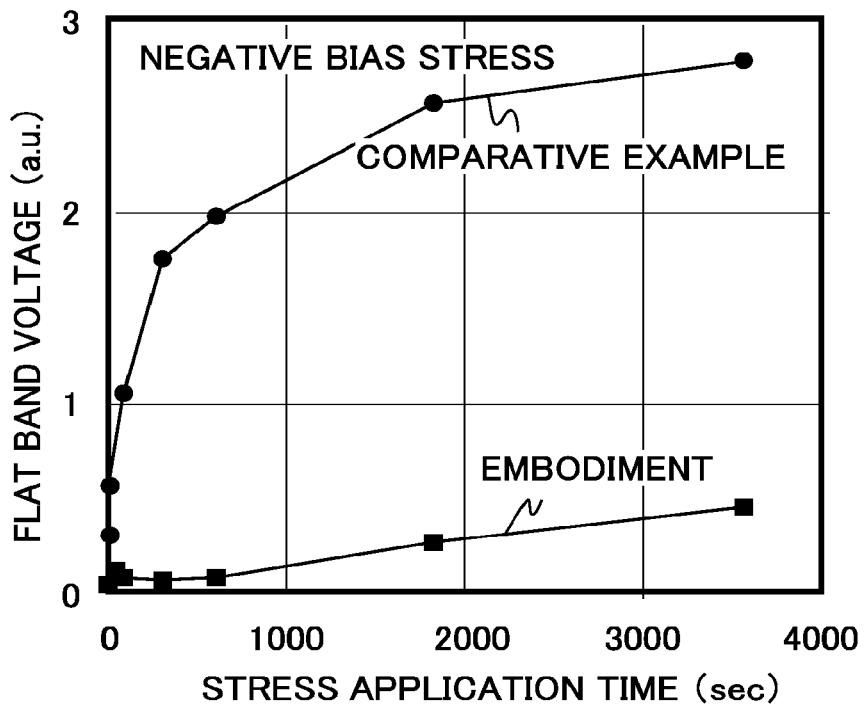
FIGS. 9A and 9B are diagrams illustrating the function of the semiconductor device according to the embodiment.
Figure 9B:
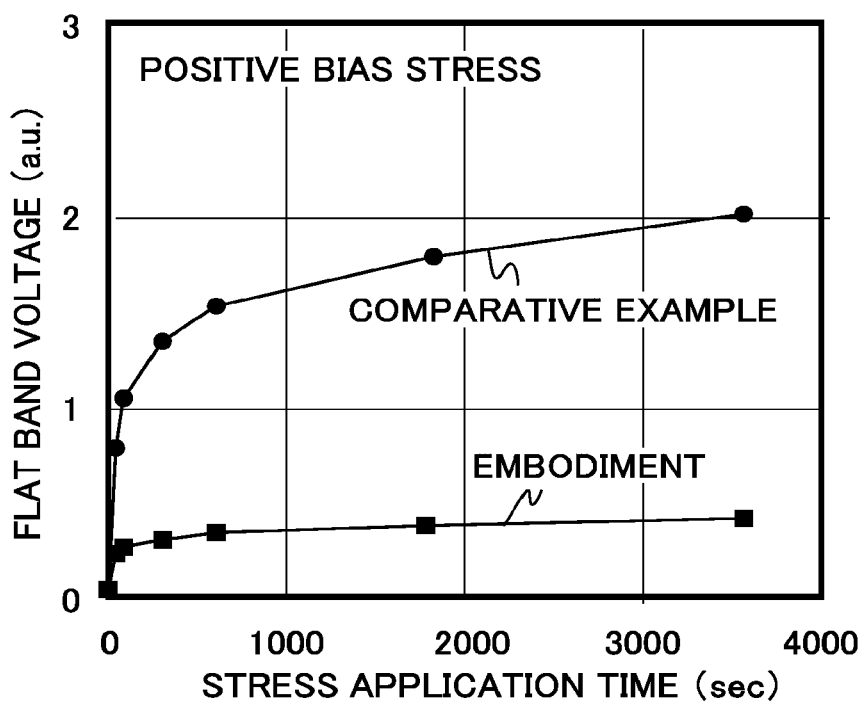
Figure 10:
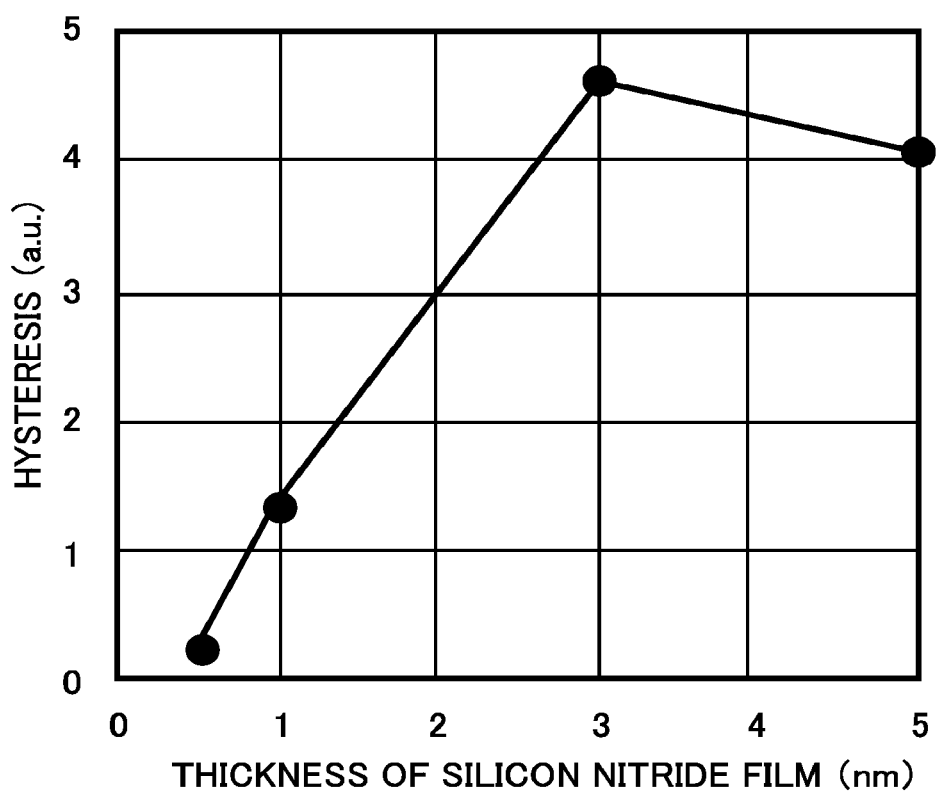
FIG. 10 is a diagram illustrating the function of the semiconductor device according to the embodiment.

FIGS. 9A and 9B illustrate the evaluation results of the flat band voltage of the MISFET in the embodiment and the comparative example. FIG. 9A illustrates a variation in the flat band voltage when negative bias stress is applied to the gate electrode and FIG. 9B illustrates a variation in the flat band voltage when positive bias stress is applied to the gate electrode. The variation in the flat band voltage is an index indicating a variation in the threshold voltage of the MISFET. As can be seen from FIGS. 9A and 9B, in the embodiment, the variation in the flat band voltage is suppressed both when the negative bias stress is applied and when the positive bias stress is applied, as compared to the comparative example.

FIG. 10 illustrates the evaluation results of the hysteresis of C-V characteristics (capacitance-voltage characteristics) of the gate insulating film. FIG. 10 illustrates the relationship between the thickness of the silicon nitride film and the magnitude of the hysteresis in the gate insulating film having the stacked structure of the silicon nitride film and the silicon oxide film.

As can be seen from FIG. 10, when the thickness of the silicon nitride film increases, the hysteresis increases. It is considered that this is caused by the trapping and detrapping of charge to and from the silicon nitride film.

Therefore, the thickness of the first insulating film 22a is preferably less than 2 nm and more preferably equal to or less than 1 nm, in order to suppress the hysteresis of the gate insulating film 22.

When the first insulating film 22a is too thin, there is a concern that a gallium oxide (GaOx) will be formed on the surface of the GaN layer while the semiconductor device is being manufactured or while a product is operating. The thickness of the first insulating film 22a is preferably equal to or greater than 0.2 nm and more preferably equal to or greater than 0.5 nm, in order to suppress the formation of the gallium oxide (GaOx).

As described above, according to the embodiment, it is possible to provide a semiconductor device in which the formation of a gallium oxide (GaOx) on the surface of a GaN layer is suppressed and a variation in the threshold voltage is suppressed and a method for manufacturing the semiconductor device.

In the above-described embodiment, AlGaN is given as an example of the material forming the GaN-based semiconductor layer. However, for example, InGaN, InAlN, and InAlGaN including indium (In) may be applied. In addition, AlN may be applied as the material forming the GaN-based semiconductor layer.

In the above-described embodiment, undoped AlGaN is given as an example of the material forming the barrier layer. However, n-type AlGaN may be applied.

In the above-described embodiment, the gate insulating film is formed by the ALD method. In particular, it is preferable to use an ALD method in order to forma high-quality thin film as the first insulating film. However, for example, other forming methods, such as an ECR sputtering method, may be applied.

In the above-described embodiment, the semiconductor layer on the buffer layer 12 has a two-layer structure of the channel layer (GaN layer) 14 and the barrier layer (GaN-based semiconductor layer) 16. However, the semiconductor layer on the buffer layer 12 may have a multi-layer structure including three of more layers.

In the above-described embodiment, the side surface of the trench is vertical. However, the side surface of the trench may have a tapered shape. It is preferable that the side surface of the trench have a tapered shape in order to improve the coverage of the film at the bottom of the trench.

While certain embodiments have been described, these embodiments have been presented by way of example only, and are not intended to limit the scope of the inventions. Indeed, a semiconductor device and a method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a GaN layer;
a GaN-based semiconductor layer provided on the GaN layer and having a wider band gap than the GaN layer;
a source electrode electrically connected to the GaN-based semiconductor layer;
a drain electrode electrically connected to the GaN-based semiconductor layer;
a gate electrode provided in the GaN-based semiconductor layer between the source electrode and the drain electrode; and
a gate insulating film provided at least between the GaN layer and the gate electrode, and between the GaN-based semiconductor layer and the gate electrode, the gate insulating film including a first insulating film and a second insulating film, the first insulating film provided between the GaN layer and the gate electrode, and between the GaN-based semiconductor layer and the gate electrode, the first insulating film having a thickness equal to or greater than 0.2 nm and less than 2 nm, the first insulating film including nitrogen, the second insulating film provided between the first insulating film and the gate electrode, the second insulating film including oxygen.

2. The device according to claim 1, wherein the second insulating film has a lower nitrogen concentration than the first insulating film.

3. The device according to claim 1, wherein the second insulating film is thicker than the first insulating film.

4. The device according to claim 1, wherein the first insulating film is a silicon nitride film, an aluminum nitride film, a silicon oxynitride film, or an aluminum oxynitride film.

5. The device according to claim 1, wherein the second insulating film is a silicon oxide film or an aluminum oxide film.

6. The device according to claim 1, wherein the thickness of the second insulating film is equal to or greater than 10 nm and equal to or less than 50 nm.

7. The device according to claim 1, wherein the gate electrode is made of a titanium nitride (TiN), tungsten (W), nickel (Ni), tungsten nitride (WN), tantalum nitride (TaN) or doped polysilicon.

8. The device according to claim 1, wherein the gate insulating film is formed inside and outside a trench extending from a surface of the GaN-based semiconductor layer to the GaN layer, and a third insulating film is provided between the GaN-based semiconductor layer and the gate insulating film formed outside the trench.

9. The device according to claim 1, wherein the thickness of the first insulating film is equal to or less than 1 nm.

10. The device according to claim 1,
wherein the first insulating film is a silicon nitride film, an aluminum nitride film, a silicon oxynitride film, or an aluminum oxynitride film,
and wherein the second insulating film is a silicon oxide film or an aluminum oxide film.

11. The device according to claim 1,
wherein the first insulating film is a silicon nitride film, an aluminum nitride film, a silicon oxynitride film, or an aluminum oxynitride film,
and wherein the second insulating film is a silicon oxide film.

* * * * *